(12) United States Patent
Bickel et al.

(10) Patent No.: US 7,349,815 B2
(45) Date of Patent: Mar. 25, 2008

(54) AUTOMATED INTEGRATION OF DATA IN UTILITY MONITORING SYSTEMS

(75) Inventors: Jon A. Bickel, Murfreesboro, TN (US); Ronald W. Carter, Murfreesboro, TN (US); Larry E. Curtis, Murfreesboro, TN (US)

(73) Assignee: Square D Company, Palatine, IL (US)

( * ) Notice: Subject to any disclaimer, the term of this patent is extended or adjusted under 35 U.S.C. 154(b) by 246 days.

(21) Appl. No.: 11/173,743

(22) Filed: Jul. 1, 2005

(65) Prior Publication Data

US 2007/0005275 A1  Jan. 4, 2007

(51) Int. Cl.
 *G06F 19/00* (2006.01)
(52) U.S. Cl. ............................. 702/60; 702/57
(58) Field of Classification Search ................ 702/60, 702/61, 62, 57
 See application file for complete search history.

(56) References Cited

U.S. PATENT DOCUMENTS

| 6,088,659 | A | 7/2000 | Kelley et al. |
| 6,094,650 | A | 7/2000 | Stoffel et al. |
| 7,089,125 | B2 * | 8/2006 | Sonderegger ................. 702/57 |
| 2002/0116282 | A1 * | 8/2002 | Martin et al. .................. 705/26 |
| 2002/0120519 | A1 * | 8/2002 | Martin et al. .................. 705/21 |
| 2003/0222509 | A1 | 12/2003 | Andarawis et al. |
| 2004/0225649 | A1 | 11/2004 | Yeo et al. |
| 2005/0050095 | A1 | 3/2005 | Hurtis et al. |

FOREIGN PATENT DOCUMENTS

| WO | WO 00/65480 | 2/2000 |
| WO | WO 00/40977 | 7/2000 |
| WO | WO 2005/059572 | 6/2005 |

OTHER PUBLICATIONS

Islei, G.; Lockett, G.; Cox, B.; Stratford, M.; "A decision support system using judgmental modeling: a case of R&D in the pharmaceutical industry";☐☐IEEE Transactions on Engineering Management; vol. 38, Issue 3; Aug. 1991; pp. 202-209.*

(Continued)

*Primary Examiner*—John Barlow
*Assistant Examiner*—Douglas N Washburn

(57) ABSTRACT

An automated integrated monitoring (IM) algorithm that automatically puts data from a utility monitoring system into context by temporally aligning the data to a common reference point and by identifying the location of each monitoring device in a hierarchy relative to other devices. Frequency variation data is received from all meters. The data is automatically aligned to a common reference point, such as a precise zero crossing, using a cross-correlation algorithm to determine the time delay at which the data is most correlated. Once the data is aligned, power data is received from all meters in a hierarchy, and the monitoring system layout is auto-learned using a correlation algorithm to determine which two meters are most likely correlated with one another based upon their historical power readings. Once the layout is complete, additional decisions regarding hardware and software configuration can automatically be made by the IM algorithm.

17 Claims, 12 Drawing Sheets

OTHER PUBLICATIONS

Article: Cross Correlation—Auto Correlation—2D Pattern Identification by Paul Bourke (Aug. 1996) 11 pages.

Article: GPS World—Pacify the Power GPS Harness for Large-Area Electrical Grid by Dennis Erickson and Carson Taylor (Apr. 1, 2005) 9 pages.

Article: Protection, Control, Reliability and Diagnostic Improvements via Single-Processor Control of Circuit Breakers in Low Voltage Switchgear © 2005, IEEE; 10 pages.

Article: Innovation to Reality—Introducing State-of-the-Art Protection and Monitoring to Existing Low-Voltage Switchgear © 2005, IEEE; 11 pages.

PCT Written Opinion for International Application No. PCT/US2006/025444, dated Oct. 10, 2006 (9 pages).

PCT Search Report for International Application No. PCT/US2006/025444, dated Oct. 10, 2006 (6 pages).

Ren C. Luo et al., "Automated Decision Tree Generation For Object Recognition And Classification" Proceedings Of The International Conference on Industrial Electronics, Control and Instrumentation (IECON). Industrial Applications of Mini, Micro and Personal Computers, Document No. XP-0020568809, dated Sep. 29, 1986 pp. 357-362.

PCT Written Opinion for International Application No. PCT/US2006/025446, dated Nov. 24, 2006 (6 pages).

PCT Search Report for International Application No. PCT/US2006/025446, dated Nov. 24, 2006 (3 pages).

Article: The Need For Speed by Richard P. Bingham, Dranetz-BMI, Nov. 1999, 12 pages.

\* cited by examiner

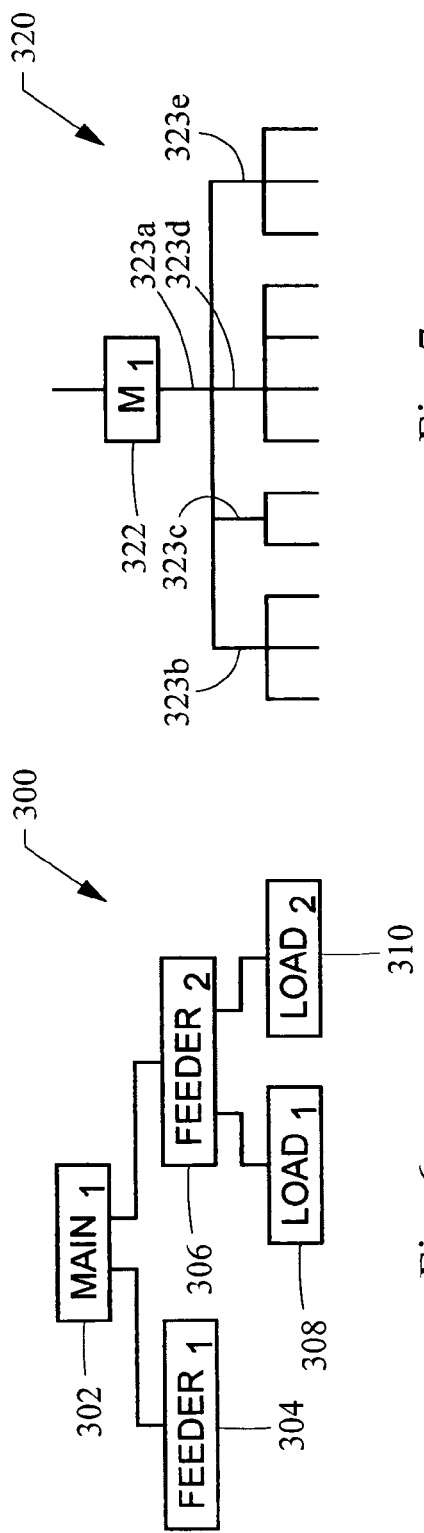
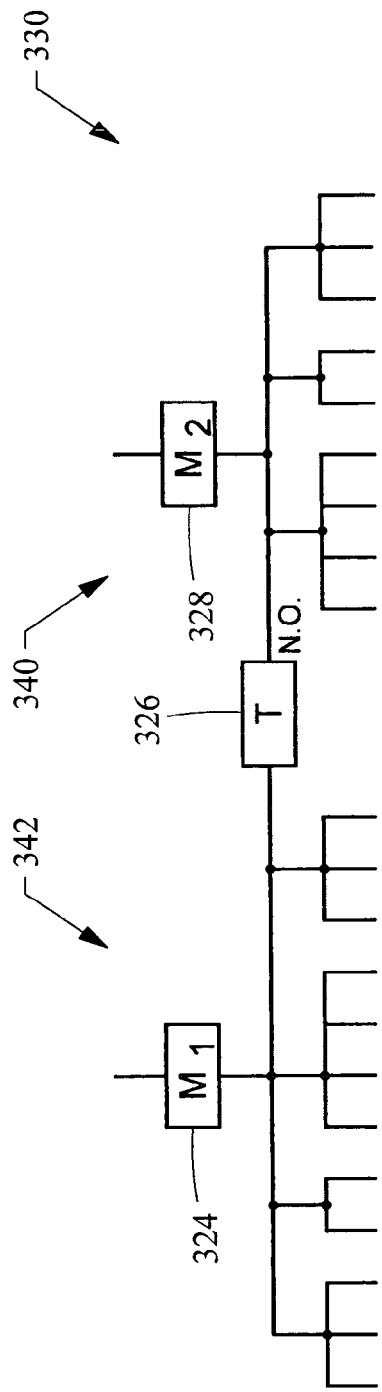
Fig. 6
Fig. 7
Fig. 8

AUTOMATED INTEGRATION OF DATA IN UTILITY MONITORING SYSTEMS

FIELD OF THE INVENTION

The present invention relates generally to utility monitoring systems, and, in particular, to automated precision alignment of data, automated determination of power monitoring system hierarchy, and automated integration of data in a utility monitoring system.

BACKGROUND OF THE INVENTION

Since the introduction of electrical power distribution systems in the late 19$^{th}$ century, there has been a need to monitor their operational and electrical characteristics. The ability to collect, analyze, and respond to information about the electrical power system can improve safety, minimize equipment loss, decrease scrap, and ultimately save time and money. To that end, monitoring devices were developed to measure and report such information. With the dawn of the electronics age, the quality and quantity of data from monitoring devices was vastly improved, and communications networks and software were developed to collect, display and store information. Unfortunately, those responsible for evaluating data from monitoring devices are now overwhelmed by information from their monitoring systems. In the endeavor to maximize the usefulness of a monitoring system, monitoring equipment manufacturers are seeking methods of presenting information in the most useful format.

Effectively monitoring today's electrical power distribution systems is cumbersome, expensive, and inefficient. Electric power monitoring systems are typically arranged in a hierarchy with monitoring devices such as electrical meters installed at various levels of the hierarchy (refer to FIG. 2). Monitoring devices measure various characteristics of the electrical signal (e.g., voltage, current, waveform distortion, power, etc.) passing through the conductors, and the data from each monitoring device is analyzed by the user to evaluate potential performance or quality-related issues. However, the components of today's electrical monitoring systems (monitoring devices, software, etc.) act independently of each other, requiring the user to be an expert at configuring hardware, collecting and analyzing data, and determining what data is vital or useful. There are two problems here: the amount of data to be analyzed and the context of the data. These are separate but related issues. It is possible to automate the analysis of the data to address the amount of data. But, in order to do this reliably, the data must be put into context. The independence of data between each monitoring device evaluating the electrical system essentially renders each monitoring device oblivious of data from other monitoring devices connected to the system being analyzed. Accordingly, the data transmitted to the system computer from each monitoring device is often misaligned in that data from each monitoring device on the system does not arrive at the monitoring system's computer simultaneously. There are two basic reasons for the temporal misalignment of data between monitoring devices: communications time delays and monitoring device timekeeping & event time stamping. It is then up to the user to analyze and interpret this independent data in order to optimize performance or evaluate potential quality-related concerns on the electrical system.

Sophisticated processing capabilities in digital monitoring devices allow large amounts of complex electrical data to be derived and accumulated from a seemingly simple electrical signal. Because of the data's complexity, quantity, and relative disjointed relationship from one monitoring device to the next, manual analysis of all the data is an enormous effort that often requires experts to be hired to complete the task. This process is tedious, complex, prone to error and oversight, and time-consuming. A partial solution has been to use global positioning satellite (GPS) systems to timestamp an event, but this approach requires that the user purchase and install additional hardware and data lines to link the monitoring devices together. And this solution still requires the evaluation of large amounts of data because the system is only temporally in context; not spatially in context. Synchronizing data using GPS systems is also disadvantageous because of time delays associated with other hardware in the system. Furthermore, any alignment of data by a GPS-based system can only be as accurate as the propagation delay of the GPS signal, which means that the data still may not be optimally aligned when a GPS system is used.

The addition of supplemental monitoring devices in the electrical system does nothing more than generate more information about the electrical system at the point where the meter is added in the electrical system, increasing complexity without any benefit. Any usefulness of the data is generally limited to the locality of the monitoring device that was added, while even more data is amassed.

The complexity of many electrical systems usually necessitates an involved configuration process of monitoring systems because each metered point in the electrical system has different characteristics, which is why multiple monitoring devices are installed in the first place. As a result of the enormous volume of complex data accumulated from electrical monitoring systems heretofore, a thorough analysis of the data is typically not feasible due to limited resources, time, and/or experience.

Temporal alignment of the data is one important aspect to understand and characterize the power system. Another important aspect is having a thorough knowledge of the power monitoring system's layout (or hierarchy). Power monitoring devices measure the electrical system's operating parameters, but do not provide information about how the parameters at different points on the power monitoring system relate to each other. Knowing the hierarchy of the power monitoring system puts the operating parameters of multiple monitoring devices into context with each other.

To determine the layout of a power monitoring system, a user must review electrical one-line drawings or physically perform an inventory of the electrical system if one-line drawings are unavailable. The user manually enters the spatial information into the monitoring system software for analysis. When a new device or monitored load is added or moved within the power monitoring system, the user must manually update the monitoring system software to reflect the new addition or change.

Data alignment and layout information are essential to understanding and characterizing the power system. With these two pieces of information, the data from each meter can be integrated and put into context with every other meter in the power system. Heretofore, the only techniques for passably integrating data were complex, expensive, manually intensive, and time-consuming for the user. These techniques also permit only limited integration of data and require additional hardware (such as GPS hardware), data lines, and supplemental monitoring device accessories.

What is needed, therefore, is an automated data integration technique, including automatic precision alignment of data and automatic hierarchical classification of system layout. The present invention is directed to satisfying this and other needs.

SUMMARY OF THE INVENTION

Briefly, according to an embodiment of the present invention, an automated integrated monitoring (IM) algorithm sends a command to meters to collect frequency data. The monitoring system software running on a host computer that includes the IM algorithm uploads the data from the meters and automatically aligns the data from all the meters in accordance with the present invention. The host computer sends a command to the meters to collect power data, and uploads the power data from the meters. The IM algorithm determines the power system layout in accordance with the present invention. When the power system layout is completed, the IM algorithm exits.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 6 is a functional block diagram of a simplified hierarchy with a single main and two feeders;

FIG. 7 is an exemplary diagram of a single radial-fed system;

FIG. 8 is an exemplary diagram of a multiple radial-fed system;

FIGS. 9-11A is a flow chart diagram of an auto-learned hierarchy algorithm in accordance with an embodiment of the present invention;

Figure 1:
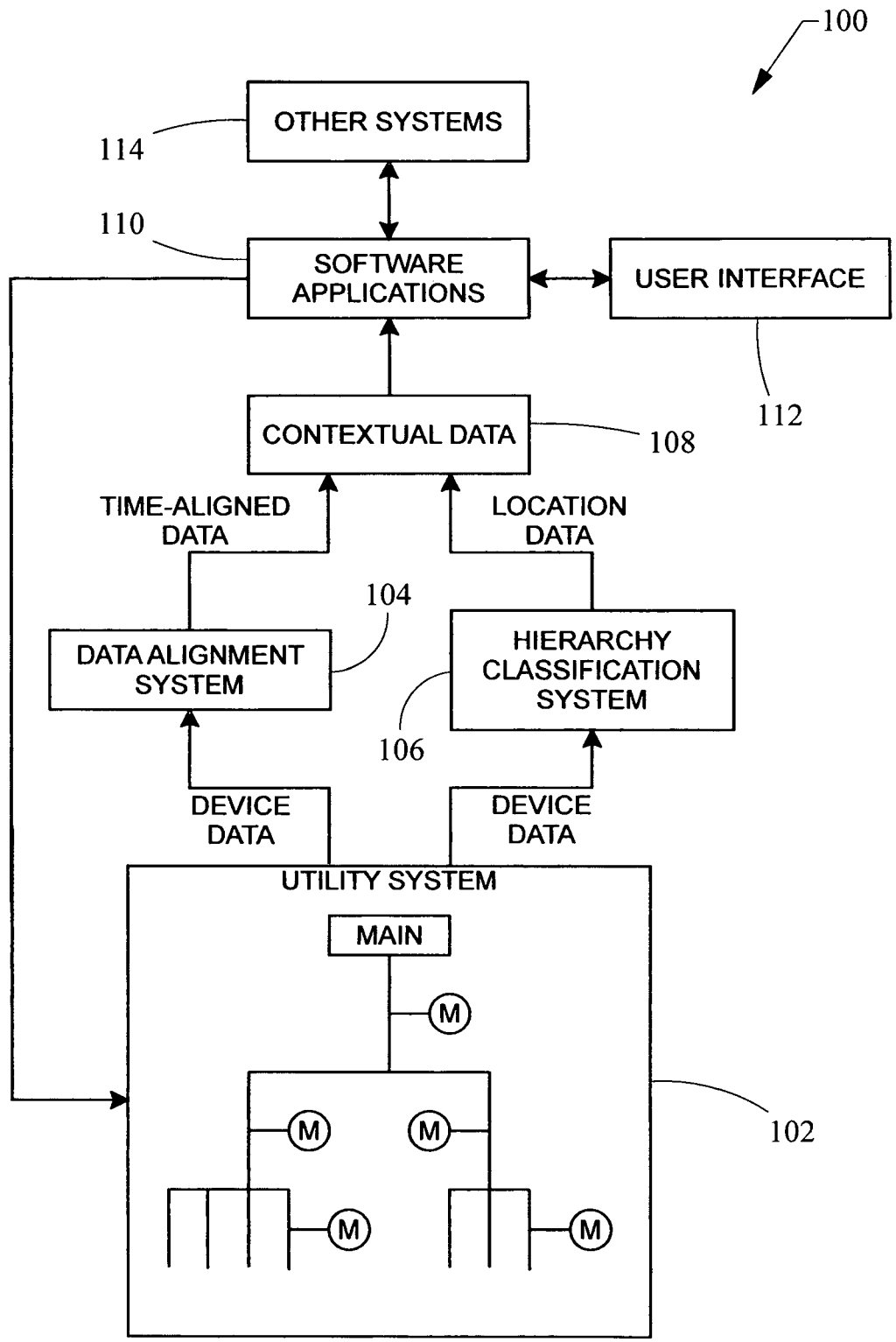
FIG. 1 is functional block diagram of an automated data integration monitoring system in accordance with the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Turning now to FIG. 1, an automated data integrated monitoring system 100 is generally shown. A utility system 102 having multiple monitoring devices M provides data from each monitoring device M that is communicated to an automated data alignment system 104 and an automated hierarchy classification system 106. The data is aligned automatically in the automated data alignment system 104 in accordance with the present invention and produces data that is aligned such that it represents the data when it was actually seen simultaneously by the monitoring devices M in the power monitoring system 102. The hierarchy classification system 106 automatically learns the hierarchy of monitoring devices present in the utility system 102 and their relationships relative to one another.

Once the data from each monitoring device M is aligned and each monitoring device's location is known, the data is said to be in context 108. The contextual data 108 can be used by software applications 110 to provide and diagnose useful information about the utility system 102 beyond what is generally available if the data is not in context. The utility being monitored in the utility system 102 can be any of the five utilities designated by the acronym, WAGES, or water, air, gas, electricity, or steam. Each monitoring device measures characteristics of the utility, and quantifies these characteristics into data that can be analyzed by a computer.

A user interacts with the software applications 110 via a conventional user interface 112. The software applications 110 can be linked to other systems 114, such as a billing system, and use the contextual data 108 to communicate messages between the other systems 114 and the user interface 112.

The data alignment system 104 aligns data, such as voltage, current, time, events, and the like, from multiple monitoring devices M in a utility system, and is a valuable tool for users. When data from all the monitoring devices M is aligned to the same point in time that the data occurred, the data can be put into a temporal context from which additional decisions regarding hardware and software configuration can be automatically made or recommended. As used herein, a monitoring device refers to any system element or apparatus with the ability to sample, collect, or measure one or more operational characteristics or parameters of a utility system 102. When the utility system 102 is a power monitoring system, the monitoring device M can be a meter that measures electrical characteristics or parameters of the power monitoring system.

The data alignment techniques (which are detailed below) according to various aspects of the present invention accomplish at least the following:

1) Automated alignment of data in monitoring devices;

2) Automated synchronization of time in monitoring devices;

3) Alignment of data and time in monitoring devices located at different points on the power utility grid (where the monitoring system software may obtain time data from the Internet or another server); and 4) Diagnosing misidentification or mislabeling of phases throughout the electrical power system.

All real-world electrical signals in power systems experience subtle variations in their frequency and amplitude over time. This variation of the signal's frequency and amplitude are both indeterminate and unique with respect to time. Each monitoring device located on the same utility grid will simultaneously experience the same frequency variations. Analysis of data from monitoring devices that are directly linked to each other in the hierarchy will reveal a correlation in their amplitude variations. Analysis of both the frequency and amplitude variations of the signal are then used to precisely align the data of one monitoring device with respect to another device (or all the monitoring devices to each other) in the data alignment system 104. The details of the data alignment system 104 are discussed below.

The data alignment techniques of the present invention allow all monitoring devices M in a power utility system hierarchy to be aligned to the zero-crossing of all three phase voltages without the use of additional hardware. The present invention also anticipates potential phase shifts between various monitoring devices, for example, those caused by certain transformer configurations. Once the data of the monitoring devices are aligned with each other, the system data is essentially aligned with respect to the time it occurred, making more complex data analyses feasible.

Figure 2:
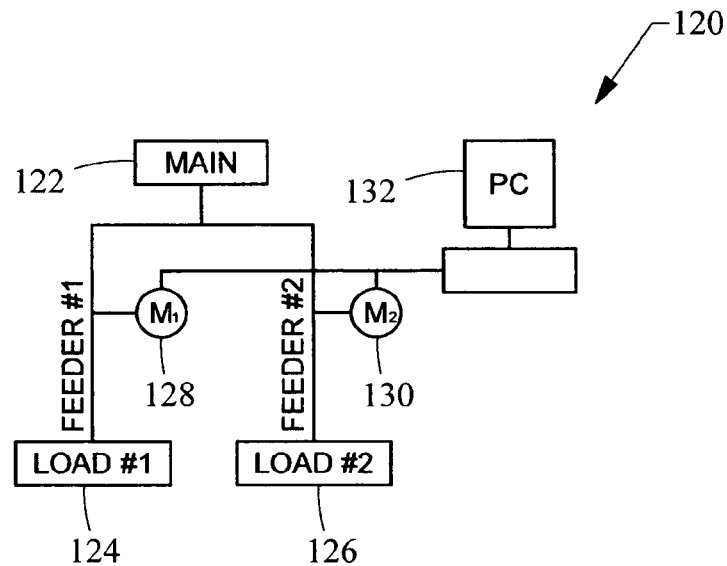
FIG. 2 is a functional block diagram of a simplified power monitoring system.

A simplified configuration of a power monitoring system 120 is shown in FIG. 2. The power monitoring system 120 includes a main 122 connected to a first load 124 by a first feeder and to a second load 126 by a second feeder. Monitoring devices 128, 130 measure electrical characteristics or parameters associated with the first and second feeders, respectively. Each monitoring device 128, 130 is communicatively coupled to a computer 132.

Figure 3:
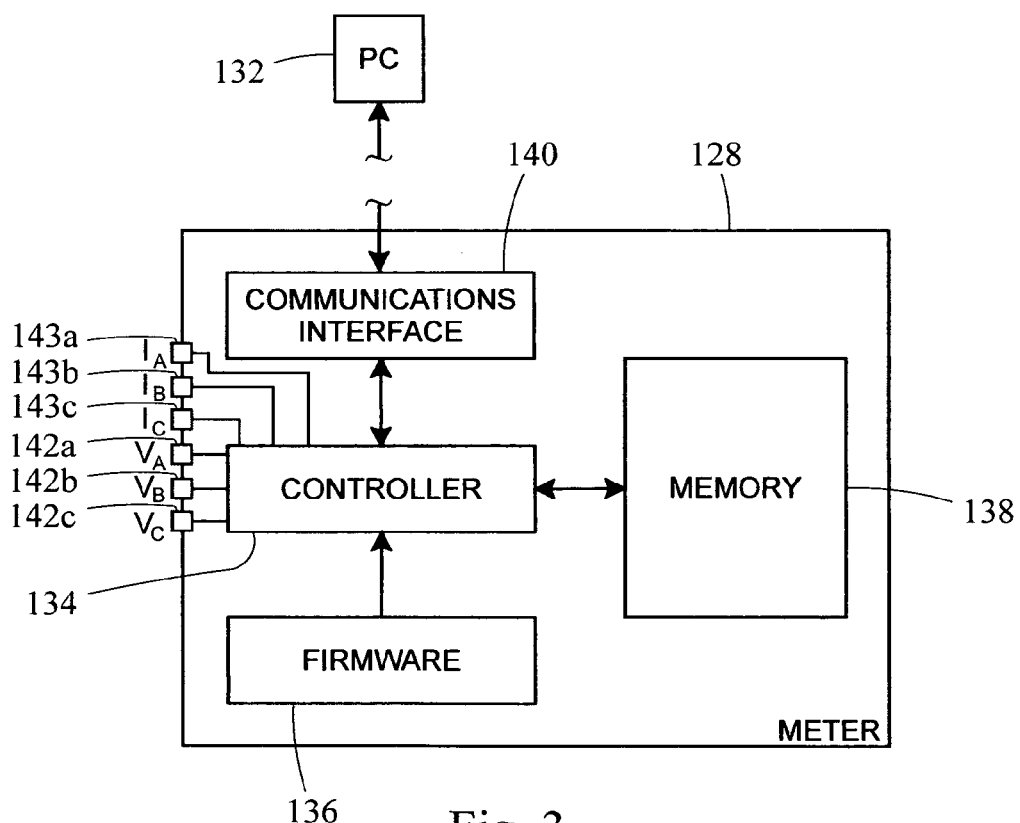
FIG. 3 is a functional block diagram of a monitoring device in accordance with an embodiment of the present invention.

The first monitoring device 128 can be a power meter (or electric meter), such as shown in FIG. 3. The monitoring device 128 includes a controller 134, firmware 136, memory 138, a communications interface 140, and three phase voltage conductor connectors 142*a,b,c*, which connect to the $V_A$, $V_B$, and $V_C$ phase voltage conductors, respectively, and are coupled to the controller 134. Three phase current conductor connectors 143*a,b,c*, which connect to the $I_A$, $I_B$, and $I_C$ phase current conductors, respectively, are optionally coupled to the controller 134. The firmware 136 includes machine instructions for directing the controller to carry out operations required for the monitoring device. Memory 138 is used by the controller 134 to store electrical parameter data measured by the monitoring device 128.

Instructions from the computer 132 are received by the monitoring device 128 via the communications interface 140. Those instructions include, according to an embodiment of the present invention, instructions that direct the controller 134 to mark the cycle count, to begin storing electrical parameter data, or to transmit to the monitoring system software 132 electrical parameter data stored in the memory 138. The electrical parameter data can include any data acquired by monitoring devices, including any combination of frequency variations, amplitude variations, and phase variations.

The present invention provides an algorithm that precisely, automatically, and temporally aligns the data from multiple monitoring devices to the same voltage zero-crossing. Other data alignment aspects discussed below are based on this capability. The data alignment aspect of the present invention is facilitated by functionality in both the monitoring device 128 and the monitoring system software running on the computer 132, and the requirements of each will be discussed individually. Collection and partial analysis of data is performed in the monitoring device 128.

From the time the monitoring device 128 is energized, a cycle count is performed of the measured voltage signals. The cycle count is sequentially iterated with each positive voltage zero-crossing (or, alternately, with each negative voltage zero-crossing). As the monitoring device 128 measures both the frequency and amplitude variations of the voltage and current from cycle to cycle, a comparison is performed to their respective nominal values. The frequency and amplitude variations and associated cycle count are tracked by the device firmware 136. The associated monitoring device time at any specified cycle count can be stored in the memory 138.

The monitoring system software executed by the computer 132 initiates alignment of the data associated with multiple monitoring devices by sending a global command to all monitoring devices 128, 130 on the power monitoring system 120 to mark their cycle count, time and buffer a predetermined amount of cycle-by-cycle data.

This predetermined amount of data is established based on the number of monitoring devices in the power monitoring system, the communications time delays in the power monitoring system and the magnitude of frequency and amplitude variations. When the buffering is complete, the monitoring devices 128, 130 transmit their buffered data to the computer 132.

Figure 4:
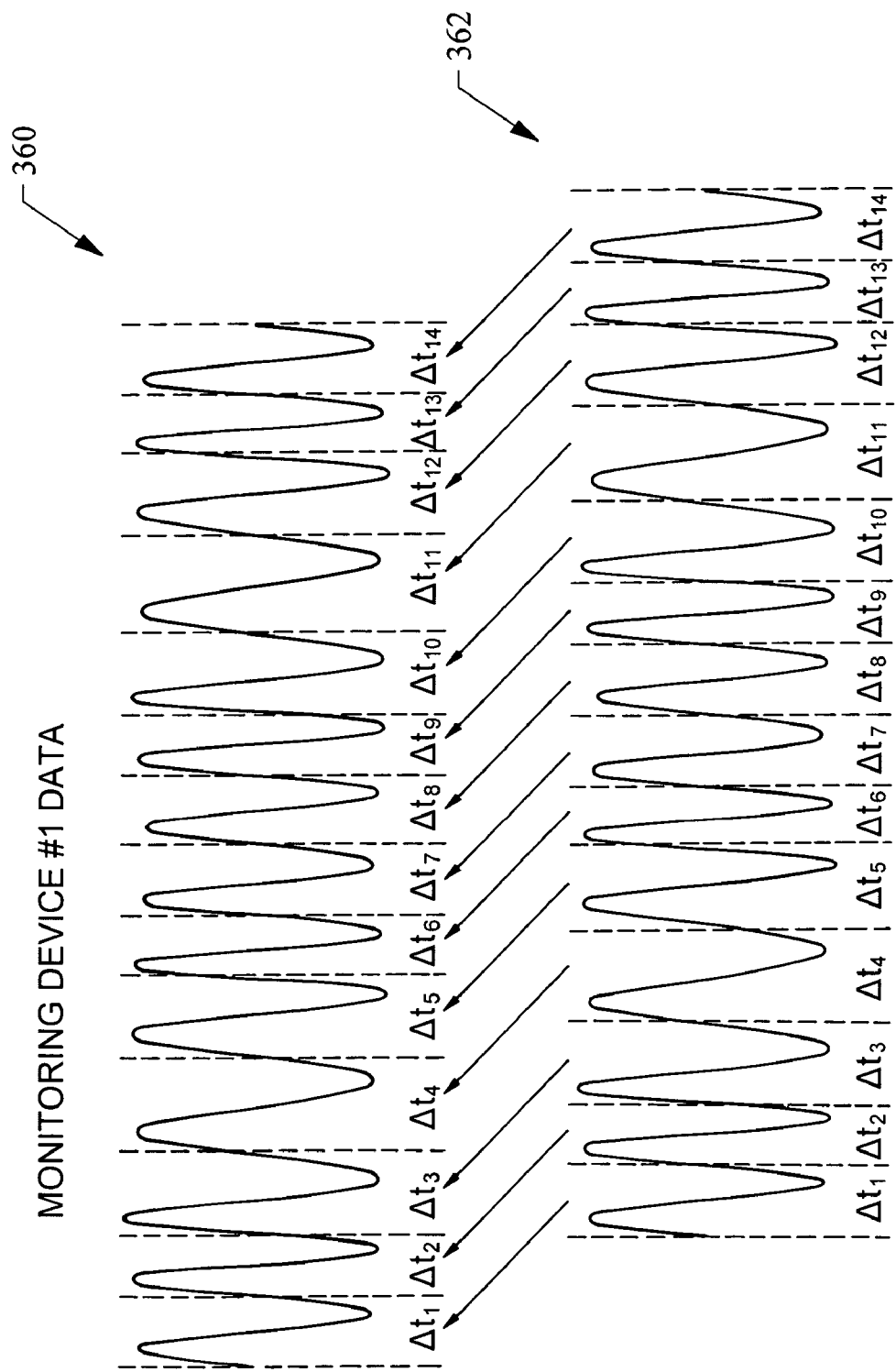
FIG. 4 are exemplary frequency data samples from two monitoring devices that are aligned in accordance with the present invention.

Once the data is collected by the monitoring devices 128, 130, the monitoring system software uploads the buffered data for analysis. There will likely be a time offset in each monitoring device's buffered data because the monitoring devices on the system will likely not begin buffering the data simultaneously due to communications time delays in the power monitoring system and internal time delays within the monitoring devices. The buffered data is analyzed by the monitoring system software on the computer 132 to locate the highest correlation in frequency between all the monitoring devices 128, 130. Generally, the highest correlation is located by sliding the buffered frequency data in one monitoring device with respect to another until the frequency variations line up with each other as shown in FIG. 4.

The frequency data 360 for the monitoring device 128 is "slid" relative to the frequency data 362 for the monitoring device 130 until the frequency data for each device line up. Thus, the zero-crossing associated with $\Delta t_1$ of monitoring device 128 is aligned with the zero-crossing associated with $\Delta t_1$ of monitoring device 130, the zero-crossing associated with $\Delta t_2$ of monitoring device 128 is aligned with the zero-crossing associated with $\Delta t_2$ of monitoring device 130, and so on. Cross-correlation algorithms for "sliding" two data sets relative to one another until they are aligned are discussed in further detail below in connection with FIGS. 5A and 5B.

Once the buffered data is aligned, the cycle count of the first monitoring device 128 is associated with the cycle count of the second monitoring device 130 in the software on the computer 132. The on-board monitoring device time may optionally also be aligned or associated relative to one another. This process is repeated for each monitoring device in the power monitoring system 120 until all devices' cycle counts are associated with each other. During the data alignment process, the monitoring system software on the computer 132 builds a matrix of each device's cycle count and time with respect to each other and the time on the computer 132.

Although FIG. 2 shows a simplified power monitoring system 120 with just two monitoring devices 128, 130, the data alignment embodiments of the present invention can be applied to any power monitoring system 120 of any complexity with multiple hierarchical levels, such as the one-line diagram shown in FIG. 7. For ease of illustration and discussion, only two monitoring devices 128, 130 have been discussed.

Once the data of the two monitoring devices 128, 130 is aligned relative to one another, there is typically no need to realign the data again unless a monitoring device loses its voltage signal or resets itself. In those cases, only the monitoring devices that lose their voltage signal or reset need to be realigned in accordance with the present invention. The data alignment technique of the present invention can be initiated by an event, such as an undervoltage or overvoltage condition, connecting or disconnecting a load to the power monitoring system, a change in the characteristics of the voltage, current, or a load, a monitoring device reset, or a power loss. The data alignment technique of the present invention can also be initiated automatically by the monitoring software or manually by the user.

Figure 5A:
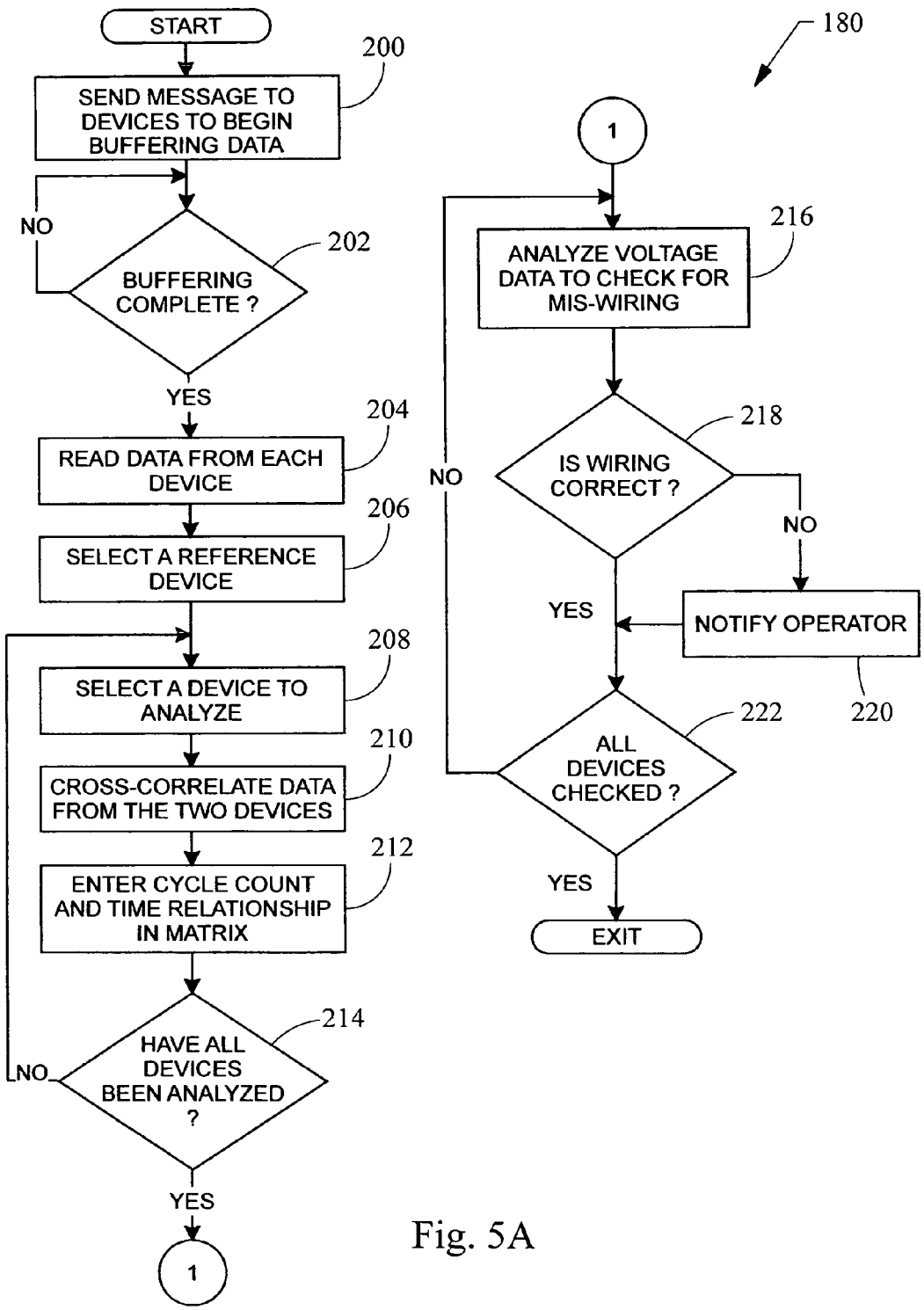
FIG. 5A is a flow chart diagram of a data alignment algorithm in accordance with an embodiment of the present invention.

Turning now to FIG. 5A, a flow chart, which can be implemented as a data alignment algorithm 180 executed by the computer 132, is shown for carrying out an embodiment of the present invention. The data alignment algorithm 180 begins by sending a message to the monitoring devices (such as monitoring devices 128, 130) to begin buffering data (200) until buffering is complete (202). The computer 132 reads the data from each device (204). The data represents, in an embodiment, electrical parameter data such as variations in (fundamental) frequency, variations in amplitude, and variations in phase. Preferably, the data represents variations in fundamental frequency. Fundamental frequency is a preferred criterion because it remains unchanged throughout the power monitoring system, even if transformers are present in the system. Amplitude and phases can shift when transformers are present in the system; however, the present invention contemplates using amplitude and phase information as criteria.

The computer 132 selects a reference monitoring device (206) such as monitoring device 128 and then selects a monitoring device to analyze (208) such as monitoring device 130. Data from the monitoring devices 128, 130 is then cross-correlated according to the present invention (210), and each device's cycle count and time relationships are entered into a matrix (212). The cross-correlation is carried out by a conventional cross-correlation algorithm, preferably such as the one provided below in Equation 1.

$$r(d) = \frac{\sum_i [(x(i) - mx) * (y(i - d) - my)]}{\sqrt{\sum_i (x(i) - mx)^2} \sqrt{\sum_i (y(i - d) - my)^2}}$$ (Equation 1)

The correlation coefficient is represented by r(d), the delay (offset or shift) being represented by d, where $-1 \leq r(d) \leq 1$ for two series x(i) and y(i) representing the respective data from the monitoring devices 128, 130; and mx and my are the means of the corresponding series x(i) and y(i). According to an embodiment, the correlation algorithm is a circular correlation algorithm in which out-of-range indexes are "wrapped" back within range. In another embodiment, the correlation algorithm is a linear correlation algorithm in which each series is repeated. In still other embodiments, the correlation algorithm is a pattern-matching algorithm or a text-search algorithm.

After cross-correlation, the computer 132 checks whether all monitoring devices have been analyzed (214), and if so, proceeds to check the wiring of the phase conductors. In many instances, phase conductors may be misidentified throughout an electrical system by the contractor who installed them. For example, the phase that is identified as "A-phase" at the main switchgear may be identified as "B-phase" at the load. This nomenclature misidentification of the phase conductors can result in confusion, and even pose a safety hazard.

To mitigate this hazard, the computer 132 analyzes the voltage (or current) data by sampling data at the voltage (or current) zero-crossing of a reference channel on each monitoring device (216). The computer 132 determines whether the wiring is correct (218) by determining whether the values of the sampled data are zero, negative, or positive, and, based on those values, assigning phase notations (such as A, B, or C) for each reference channel. If all monitoring devices are identified accurately, the data values for Phase-A should be approximately zero. If the data values are negative, then the phase in question is the "B-Phase" for an ABC phase rotation. If the data values are positive, then the phase in question is the "C-phase" for an ABC phase rotation. The user is notified (220) whether the wiring is correct. Once the proper phase notation is determined for each monitoring device (222), the computer 132 may then allow the user to correct the misidentified phase notation in any or all monitoring devices. The phase diagnosis embodiments according to the present invention are applicable to voltage inputs as well as current inputs.

Figure 5B:
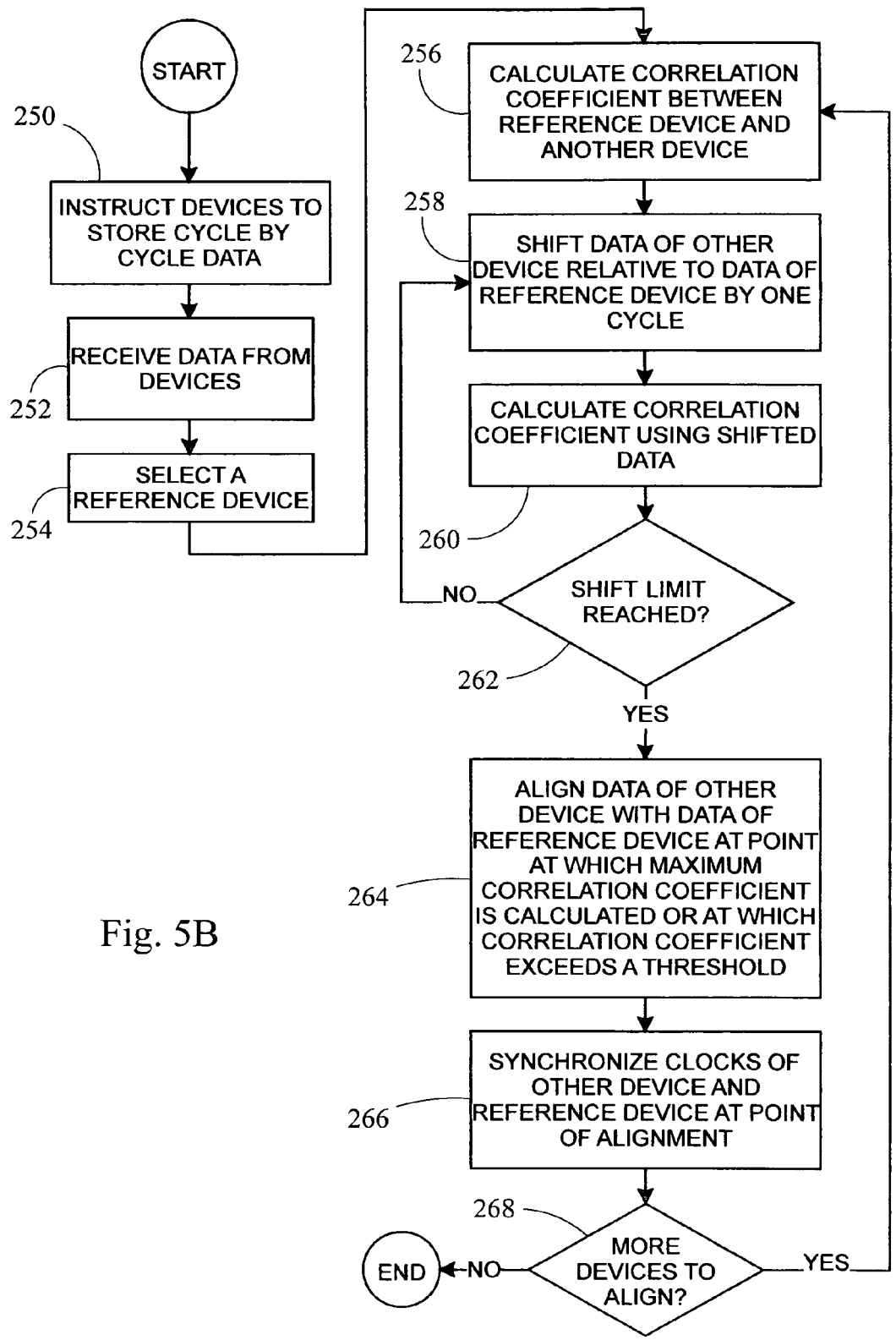
FIG. 5B is a flow chart diagram of a data alignment algorithm in accordance with another embodiment of the present invention.

FIG. 5B illustrates a flow chart for carrying out another embodiment of the present invention. As with FIG. 5A, reference will be made to the power monitoring system 120 shown in FIG. 2 for ease of discussion, but as mentioned before, the data alignment techniques of the present invention are applicable to any utility monitoring system.

The computer 132 instructs each monitoring device in the power monitoring system 120 to store data on a cycle-by-cycle basis (250) for a predetermined number of cycles, preferably between about 1,000 and about 10,000 cycles. When a sufficient amount of data has been stored by the monitoring devices, the computer 132 receives the data from the monitoring devices (252) and selects a reference monitoring device (254). Using a convention cross-correlation algorithm such as Equation 1 above, the computer 132 calculates a correlation coefficient r(d) between at least a portion of the data (such as about 400 cycles) of the reference monitoring device and the data of a second monitoring device (256). The calculated correlation coefficient is stored, and the data of the second monitoring device is shifted relative to the reference device by one cycle (258).

As mentioned above, the out-of-range indexes can be wrapped back within range according to a circular correlation algorithm or the indexes can be repeated according to a linear correlation algorithm. A correlation coefficient is calculated using the shifted data (260) and if no further shifts are required (262), the data of the second monitoring device is aligned with the data of the reference device at the point at which the maximum correlation coefficient is calculated or at which the correlation coefficient exceeds a threshold value, such as 0.5 (264). It should be noted that when the correlation coefficient r(d) is close to 1.0, the algorithm can exit without conducting any further shifts.

The computer 132 synchronizes the clocks of the second monitoring device and the reference device at the point of alignment (266). The computer 132 reads the cycle count in each monitoring device and the associated monitoring device's on-board clock time. A monitoring device's on-board clock time and cycle count may drift with respect to each other due to the limitations of the on-board clock. Once the data is aligned, the cycle count is considered the absolute reference for a monitoring device. Due to the clock drift, it may be necessary to re-read the time associated with a device's cycle count periodically to reestablish the device's time. The software on the computer 132 will then update the matrix containing the monitoring device time information.

Another capability of this feature is to allow all on-board monitoring device clocks to be periodically reset to the same value to provide a standard time for the entire power monitoring system. Preferably, the time within the monitoring system software (running on the computer 132) is set according to some absolute time reference. Once the computer time is set, the monitoring system software resets the time on all the monitoring devices accordingly. In this embodiment, the data and time of each monitoring device and the software would be more accurately aligned with the absolute time reference.

When there are no further monitoring devices to align (268), the procedure ends. In an alternate embodiment, all of the monitoring device's data is aligned before the clocks are synchronized (266).

Another advantage of the data alignment techniques of the present invention is the ability to align data and time on different points of the utility grid. If monitoring devices are located on two different points of the same utility grid, it is possible to align the monitoring devices together. In this embodiment, the monitoring devices at each geographic location are first aligned to each other in accordance with the present invention. The software managing all the systems is then used as the absolute time reference for all systems, giving them all a common point of reference.

Referring back to FIG. 1, the integrated monitoring system 100 includes the hierarchy classification system 106. Having a thorough knowledge of an electrical power system's layout is essential to understanding and characterizing the system. Power meters typically provide only the electrical system's operating parameters, but do not give information on how the parameters at different monitoring points on the electrical system relate to each other. Having the hierarchy of an electrical system puts the operating parameters of multiple monitoring devices into spatial context with each other. This spatial context gives the user a more powerful tool to troubleshoot system problems, improve system efficiencies, predict failures and degradation, locate the source of disturbances, or model system responses.

The hierarchy classification system 106 of the present invention allows the monitoring system software to collect data from the monitoring device on the utility system 102, and automatically determine the hierarchy of the utility system 102 with little or no user input. The level of detail given by the hierarchy classification system 106 directly correlates with the number and extent of monitoring devices in the utility system 102. As supplemental monitoring devices are added, the auto-learned hierarchical algorithm according to the present invention enables them to be automatically incorporated into the determined hierarchical structure.

A hierarchy of nodes is based on a relationship that determines that one node is always greater than another node, when the nodes are related. A hierarchy's relationship can link or interrelate elements in one of three ways: directly, indirectly, or not at all. An illustration of a direct link or interrelationship is shown in FIG. 6 between the $Load_2$ 310 and $Feeder_2$ 306. In contrast, an indirect link exists between $Load_2$ 310 and $Main_1$ 302. Finally, there is effectively no link between the $Load_1$ 308 and $Load_2$ 310 and between $Feeder_1$ 304 and $Feeder_2$ 306.

In the case of a power system hierarchy, an objective is to order elements in the power system so as to represent the true connection layout of the power system. Determining the hierarchy of a power system provides important information that can be used to solve problems, increase equipment and system performance, improve safety, and save money. The level of detail contained in a power system hierarchy will depend on both the number of elements or nodes that are being monitored and the node's ability to provide feedback to the auto-learned hierarchy algorithm in the monitoring system software running on the computer 132.

Generally, the hierarchy classification system 106 according to the present invention utilizes an auto-learned hierarchy algorithm in the monitoring system software that is based on rules and statistical methods. Periodically, the monitoring system software polls each monitoring device in the utility system 102 to determine certain characteristics or parameters of the utility system 102 at that node (represented by monitoring device M). Multiple samples of specified parameters are taken from each meter in the system at the same given point in time. Once the parameter data is collected from each node M in the utility system 102, the auto-learned hierarchy algorithm analyzes the data and traces the relationships or links among the monitoring devices with respect to the time the data sample was taken and the associated value of the data sample. This analysis may be performed periodically to increase the probability that the hierarchy is accurate, or to ascertain any changes in the hierarchy. Once this iterative process reaches some predetermined level of statistical confidence that the determined layout of the utility system 102 is correct, the auto-learned hierarchy algorithm ends. The final layout of the utility system 102 is then presented to the user for concurrence. As each monitoring device's data is evaluated over time (the learning period) with respect to all other monitoring devices using the auto-learned hierarchy algorithm, a basic layout of the hierarchical structure of the utility system 102 is determined based on the monitoring points available. In this respect, the algorithm according to the present invention uses historical trends of the data from each monitoring device, and those trends are compared to determine whether any interrelationship (link) exists between the monitoring devices. A more detailed hierarchical structure can be determined with more monitoring points available for analysis.

A benefit of the auto-learned hierarchy algorithm of the present invention is to provide automatically a basic hierarchical structure of a utility system being monitored with minimal or no input by the user. The hierarchy can then be used as a tool for evaluation by other systems 114. Another benefit is that the present invention improves the accuracy of the time synchronization between the monitoring devices and the monitoring system software.

In an embodiment in which the utility system 102 is a power monitoring system, samples of specific electrical parameters (such as power, voltage, current, or the like) are simultaneously taken from each monitoring device in the power monitoring system. This parameter data is stored and analyzed with respect to the time the sample is taken, the associated value of the data point, and the monitoring device providing the data.

Data taken from each monitoring device in the power monitoring system is compared with each other to determine whether any correlation exists between the monitoring devices. The data is analyzed for statistical trends and correlations as well as similarities and differences over a predetermined period of time in accordance with the present invention.

According to an embodiment, one or more rules or assumptions are used to determine the hierarchical order of the power system. Certain assumptions may have to be made about the utility system in order to auto-learn the utility system's hierarchy. The assumptions are based on Ohm's Law, conservation of energy, and working experience with typical power distribution and power monitoring systems.

General rules that may be made by the auto-learned hierarchy algorithm in connection with power systems and power monitoring systems include:

1. The power system being analyzed is in a single 320 (FIG. 7) or multiple radial feed configuration 330 (FIG. 8).
2. The meter measuring the highest energy usage is assumed to be at the top of the hierarchical structure (e.g., Main 322 shown in FIG. 7).
3. The rate of sampling data by the meters is at least greater than the shortest duty cycle of any load.
4. Energy is consumed (not generated) on the power system during the parameter data collection process.
5. The error due to the offset of time in all meters on the power monitoring system is minimal where data is pushed from the monitoring device to the monitoring system software running on the computer 132.

The following additional parameters may be present for the auto-learned hierarchy algorithm:

1. Data is not collected for hierarchical purposes from two monitoring devices installed at the same point of a power system.
2. Meters with no load are ignored or only use voltage information to determine their position in the hierarchy.
3. Multiple mains (Main1, Main2, Main3, etc.) may exist in the power system.
4. Data is provided to the monitoring system software by each monitoring device in the system.
5. Loads that start or stop affect the load profiles for any corresponding upstream metered data with a direct or indirect link to that load.
6. Voltage characteristics (fundamental, harmonic, symmetrical components) are relatively consistent for all monitoring devices on the same bus.
7. Transformer losses on the electrical system are minimal with respect to the loads downstream from the transformer.
8. General correlation (over time) of loads between monitoring devices indicates either a direct or indirect link.
9. Multiple unmetered loads at a point in the power system are aggregated into a single unknown load.

Any of the foregoing assumptions and parameters can be combined for a radial-fed electrical power system. For example, in a specific embodiment, the following rule-based assumptions and parameters can be utilized:

1. Voltages and currents are higher the further upstream (closer to the top of the hierarchy) a monitoring device is.
2. Harmonic values are generally lower the further upstream a monitoring device is.
3. Transformers can vary the voltages and currents.
4. Total power flow is higher upstream than downstream.
5. The power system is a radial-fed system.
6. Two monitoring devices will not be installed at the same point.
7. Monitoring devices with the same voltage distortion are adjacently connected.
8. The total load measured at a specific hierarchical level is equal (excluding losses) to the sum of all measured and unmeasured loads directly linked to that hierarchical level.

Monitoring devices are considered to be on the same hierarchical level if they are all directly linked to the same reference device. For example, referring to FIG. 7, a simplified one-line diagram of a utility monitoring system 320 is shown having five distinct levels represented by 323$a,b,c,d,e$. In the specific case of a power monitoring system, each level represents a feeder to which multiple monitoring devices can be directly linked. All monitoring devices directly linked to a feeder are considered to be on the same feeder level. Thus, the main 322 is directly linked to the feeder 323$a$, and thus exists on its own level in the hierarchy. Feeder 323$b$ directly links to three monitoring devices, and therefore comprises another distinct level. Feeder 323$c$ comprises another level distinct from feeders 323$a$ and 323$b$ because the monitoring devices directly linked to feeder 323$c$ are not directly linked to feeders 323$a$ or 323$b$. In the case of a water, air, gas, and steam systems, each level may be represented by a header instead of a feeder.

A specific aspect of the auto-learned hierarchy algorithm 400 in accordance with an embodiment of the present invention is flow-charted in FIGS. 9-11A. The algorithm 400 first checks whether there is more than one monitoring device in the system (402), and if not, the algorithm ends. If more than one monitoring device is present, electrical data is taken from each monitoring device ($M_1, M_2, \ldots, M_k$) and compiled into a Data Table (404). The Data Table tabulates the raw data (such as power, voltage magnitude, voltage distortion, current magnitude, current distortion, or symmetrical component data) taken at regular intervals ($T_1, T_2, \ldots, T_n$) over a given time period. The time period between samples depends on the shortest duty cycle of any load in the power monitoring system. The maximum time period ($T_n$) is determined based on the level of variation of each monitoring device's load in the power monitoring system. The monitoring device with the maximum power in the Data Table is assumed to be a Main (i.e., highest level in the electrical hierarchy) (408). However, the present invention also contemplates multiple hierarchies (i.e., multiple Mains). An example of the Data Table is shown in Table 1 below.

TABLE 1

Data Table Example

| Time | Meter 1 | Meter 2 | Meter 3 | Meter 4 | ... | Meter k |
|---|---|---|---|---|---|---|
| $T_1$ | $D_{11}$ | $D_{21}$ | $D_{31}$ | $D_{41}$ | ... | $D_{k1}$ |
| $T_2$ | $D_{12}$ | $D_{22}$ | $D_{32}$ | $D_{42}$ | ... | $D_{k2}$ |
| $T_3$ | $D_{13}$ | $D_{23}$ | $D_{33}$ | $D_{43}$ | ... | $D_{k3}$ |
| $T_4$ | $D_{14}$ | $D_{24}$ | $D_{34}$ | $D_{44}$ | ... | $D_{k4}$ |
| . | . | . | . | . | . | . |
| . | . | . | . | . | . | . |
| $T_n$ | $D_{1n}$ | $D_{2n}$ | $D_{3n}$ | $D_{4n}$ | ... | $D_{kn}$ |

Once the data for the Data Table is accumulated, a Check Matrix is developed. The Check Matrix is a matrix of logical connections based on the Data Table. A zero (0) indicates that no direct link exists between any two monitoring devices, and a one (1) indicates that there is a possible relationship between two monitoring devices. An exemplary Check Matrix is illustrated in Table 2 below. In Table 2, it is assumed that no link exists between Meter 1 and Meter 2. This is because the power measured by Meter 1 exceeds Meter 2 in one entry of the Data Table and the power measured by Meter 2 exceeds Meter 1 in another entry of the Data Table. Meter 1 always correlates with itself so an NA is placed in that cell of the Check Matrix. Only half of the Check Matrix is required due to the redundancy of information.

TABLE 2

Check Matrix Example

|  | Meter 1 | Meter 2 | Meter 3 | Meter 4 | ... | Meter k |
|---|---|---|---|---|---|---|
| Meter 1 | NA | 0 | 1 | 1 | ... | 0 |
| Meter 2 | 0 | NA | 1 | 0 | ... | 1 |
| Meter 3 | 1 | 1 | NA | 0 | ... | 1 |
| Meter 4 | 1 | 0 | 0 | NA | ... | 0 |
| . | . | . | . | . | ... | . |
| . | . | . | . | . |  | . |
| Meter k | 0 |  | 1 | 0 | ... | NA |

Once the Check Matrix is determined, the data from each monitoring device in the Data Table is used to develop a Correlation Coefficient Matrix (CCM) shown in Table 3 below. In the CCM, a statistical evaluation is carried out to determine the linear relationship of each monitoring device in the electrical system with respect to the other monitoring devices in the matrix. The correlation coefficient between any two monitoring devices is determined and placed in the appropriate cell in the CCM. In the exemplary Table 3 below, $C_{12}$ is the correlation coefficient of Meter 1 with respect to Meter 2. The higher the correlation coefficient value is, the higher the probability that these two monitoring devices are either directly or indirectly linked. Conversely, the lower this number is, the lower the probability that these two monitoring devices are directly or indirectly linked. Equation 2 below is used to determine the correlation coefficient between any two given monitoring devices:

$$\rho_{x,y} = \frac{\text{Cov}(x, y)}{\sigma_x \sigma_y} \quad \text{(Equation 2)}$$

where: $\rho_{x,y}$ is the correlation coefficient and lies in the range of $-1 \leq \rho_{x,y} \leq 1$,; Cov(x,y) is the covariance of x and y; and $\sigma_x$ and $\sigma_y$ are the standard deviations of x and y, respectively.

$$\text{Cov}(x, y) = \frac{1}{n}\sum_{j=1}^{n}(x_j - \mu_y)(y_j - \mu_y) \quad \text{(Equation 3)}$$

where: n is the number of data elements in x and y, and $\mu_x$ and $\mu_y$ are the mean values of x and y respectively.

The diagonal cells of the Correlation Matrix are all always 1 because each meter has 100% correlation with itself. Again, only half of the Correlation Matrix is required due to the redundancy of data (e.g., $C_{12}=C_{21}$).

TABLE 3

Correlation Coefficient Matrix (CCM) Example

|  | Meter 1 | Meter 2 | Meter 3 | Meter 4 | ... | Meter k |
|---|---|---|---|---|---|---|
| Meter 1 | 1 | $C_{12}$ | $C_{13}$ | $C_{14}$ | ... | $C_{1k}$ |
| Meter 2 | $C_{21}$ | 1 | $C_{23}$ | $C_{24}$ | ... | $C_{2k}$ |
| Meter 3 | $C_{31}$ | $C_{32}$ | 1 | $C_{34}$ | ... | $C_{3k}$ |
| Meter 4 | $C_{41}$ | $C_{42}$ | $C_{43}$ | 1 | ... | $C_{4k}$ |
| . | . | . | . | . | 1 | . |
| . | . | . | . | . |  | . |
| Meter k | $C_{k1}$ | $C_{k2}$ | $C_{k3}$ | $C_{k4}$ | ... | 1 |

Returning to FIG. 9, a list of meters is developed for each level of the hierarchy under consideration. The top-most level is assumed to be the meter with the largest power reading, which is assumed to be a main. Once that meter is found in the Data Table (408), the algorithm 400 places the main in a feeder level list of the hierarchy and clears the list of monitoring devices on the current feeder level in the hierarchy (410). In subsequent iterations through the MAIN LOOP, the algorithm 400 places the reference meter in the previous feeder level list of the hierarchy. It should be understood that on the first iteration, there is no previous level list. The algorithm 400 clears a Correlation Reference Array (CRA) (412), and designates the main as the reference monitoring device (414). An exemplary CRA is shown in Table 4, below, for n iterations for a given feeder level. $C_5$, corresponds to the correlation coefficient between meter 5 (the reference meter) and meter 1, $C_{52}$ corresponds to the correlation coefficient between meter 5 and meter 2, and so forth. Initially, the CRA is cleared for each feeder level, and the algorithm 400 develops a new CRA for each feeder level by populating each iteration column with correlation coefficients for all meters on the current feeder level. A specific example is explained in connection with Table 5 below.

The Correlation Coefficient Matrix (CCM) is calculated based on the power data (416). In the first iteration, the only known element in the hierarchy is the main, and the hierarchy is auto-learned from the top-most feeder level down, in accordance with some or all of the assumptions or parameters listed above.

TABLE 4

Correlation Reference Array (CRA) Example

| Iteration 1 | Iteration 2 | Iteration 3 | Iteration 4 | Iteration 5 | ... | Iteration n |
|---|---|---|---|---|---|---|
| $C_{51}$ | $C_{51}$ | $C_{51}$ | $C_{51}$ | $C_{51}$ | ... | $C_{51}$ |
| $C_{52}$ | $C_{52}$ | $C_{52}$ | $C_{52}$ | $C_{52}$ | ... | $C_{52}$ |
| $C_{53}$ | $C_{53}$ | $C_{53}$ | $C_{53}$ | $C_{53}$ | ... | $C_{53}$ |
| $C_{54}$ | $C_{54}$ | $C_{54}$ | $C_{54}$ | $C_{54}$ | ... | $C_{54}$ |
| ... | ... | ... | ... | ... | ... | ... |
| $C_{5m}$ | $C_{5m}$ | $C_{5m}$ | $C_{5m}$ | $C_{5m}$ | ... | $C_{5m}$ |

Figure 10:
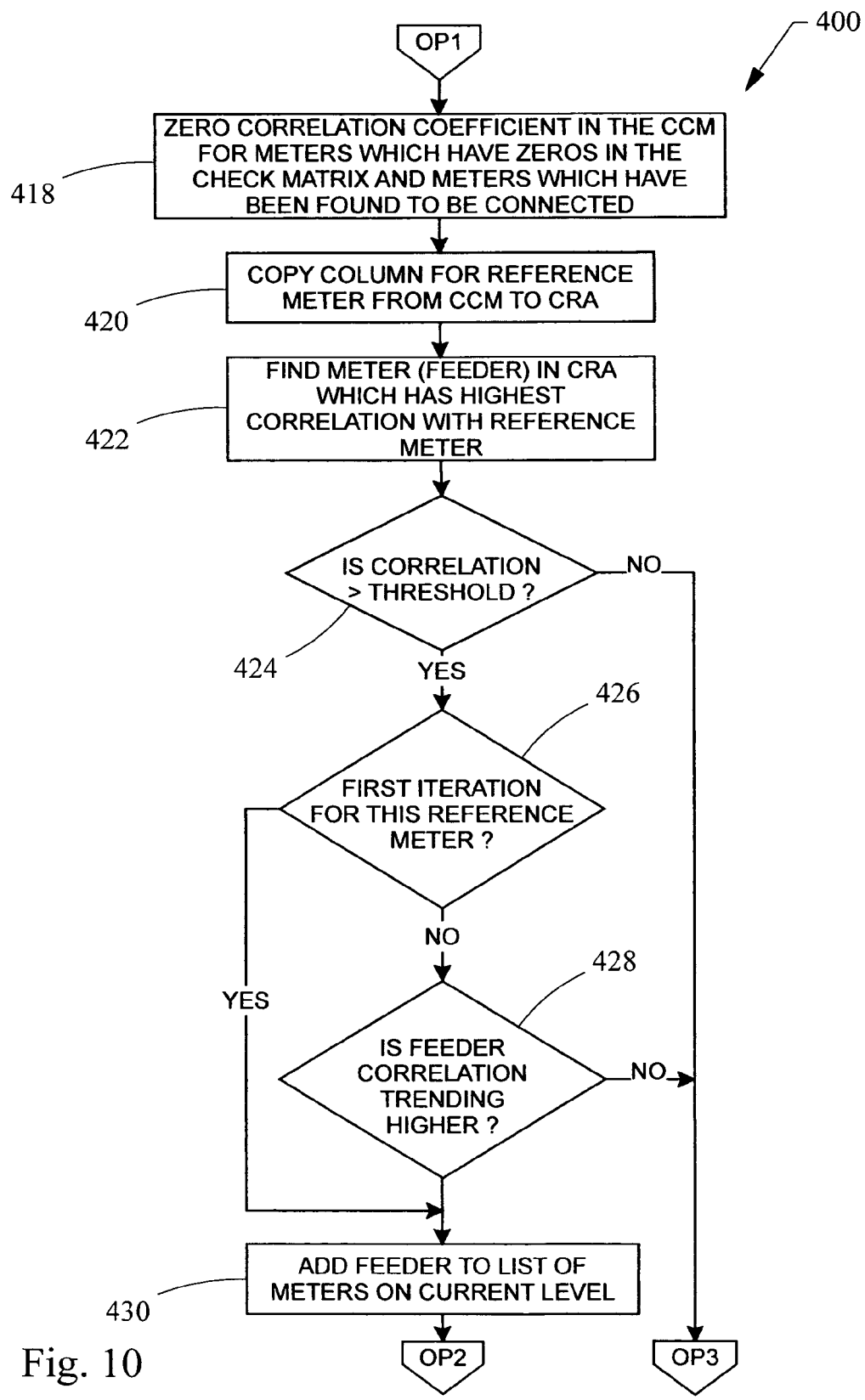

Continuing with FIG. 10, the algorithm 400 zeros the correlation coefficients in the CCM for meters that have zeros in the Check Matrix and meters that have already been found to be connected (418). The column for the reference monitoring device is copied from the CCM to the CRA (420). A specific example will be explained next in connection with Table 5 below. Assume that meter 5 in the CCM is designated as the reference meter (414). The algorithm 400 calculates the CCM based on the Data Table (416) and zeroes the correlation coefficient(s) in the CCM for meters that have zero in the Check Matrix and meters that have been found to be connected (418). The column in the CCM corresponding to meter 5 is copied into the column Iteration 1 of the CRA. Referring to Table 5, meter 11 has the highest correlation with meter 5 of 0.649, and meter 11 is marked as connected with meter 5 for the current feeder level.

In Iteration 2, meter 11's power is subtracted from meter 5's power in the data table, and the meter 5-11 correlation coefficient drops to −0.048 in Iteration 2, which provides a high degree of confidence that meter 11 is interrelated with meter 5. Also noteworthy is that some meter's correlation coefficients trend higher as the iterations progress. For example, the correlation coefficients for meter 18 relative to meter 5 gradually increase from 0.296 in Iteration 1 to 0.417 in Iteration 2 to 0.436 in Iteration 3 to 0.525 in Iteration 4 and finally to 0.671 in Iteration 5, which is the highest correlation coefficient among all the meters (meter 5 correlated with itself is always 1.0, so its correlation coefficient is ignored). This increasing trend also provides a high degree of confidence that meter 18 is also directly linked with meter 5, and this link is finally confirmed in Iteration 5. The same increasing trends can be observed for meters 12 and 15, for example. In Iteration 7, none of the correlation coefficients exceed a threshold, and the algorithm 400 proceeds to analyze the next feeder level. By Iteration 7, the algorithm 400 has determined that meters 11, 12, 14, 15, 18, and 20 are directly linked with meter 5.

Figure 11A:
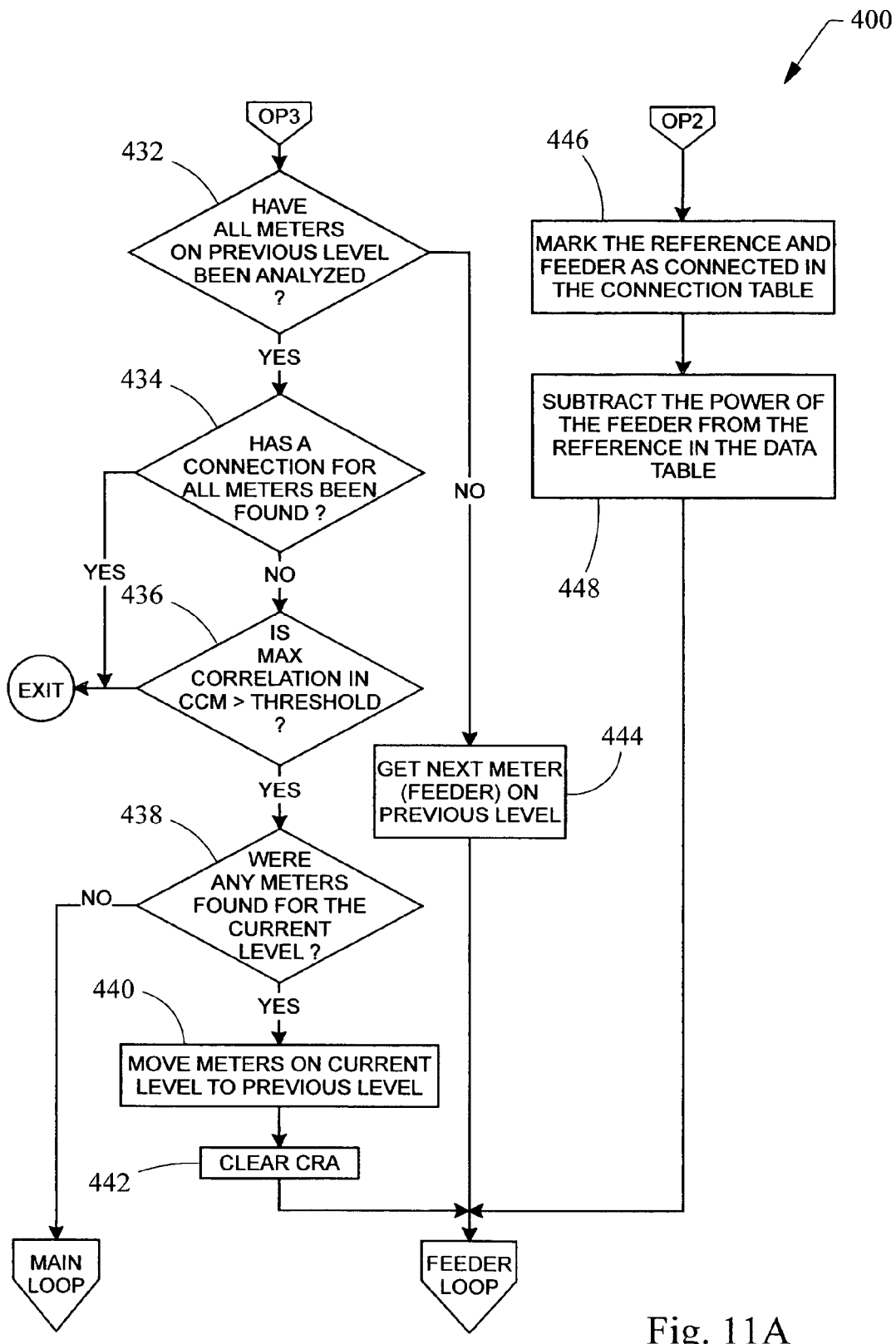

If the current iteration is the first iteration for the reference monitoring device, the feeder is added to the list of monitoring devices on the current level of the hierarchy (430), and the algorithm 400 continues to FIG. 11A (OP2). The reference monitoring device and the feeder are designated as directly linked (or interrelated) in a connection table (446), and the power associated with the feeder is subtracted from the reference monitoring device in the data table (448). The connection table maintains a list of devices and their interrelationships (for example, whether they are directly linked). By subtracting the power of the feeder associated with the highest correlation coefficient relative to the reference monitoring device, other feeders (monitoring devices) connected to the reference monitoring device will see their correlation coefficients increase. The algorithm 400 returns to the FEEDER LOOP of FIG. 9, and the next iteration continues with the remaining monitoring devices.

Figure 9:
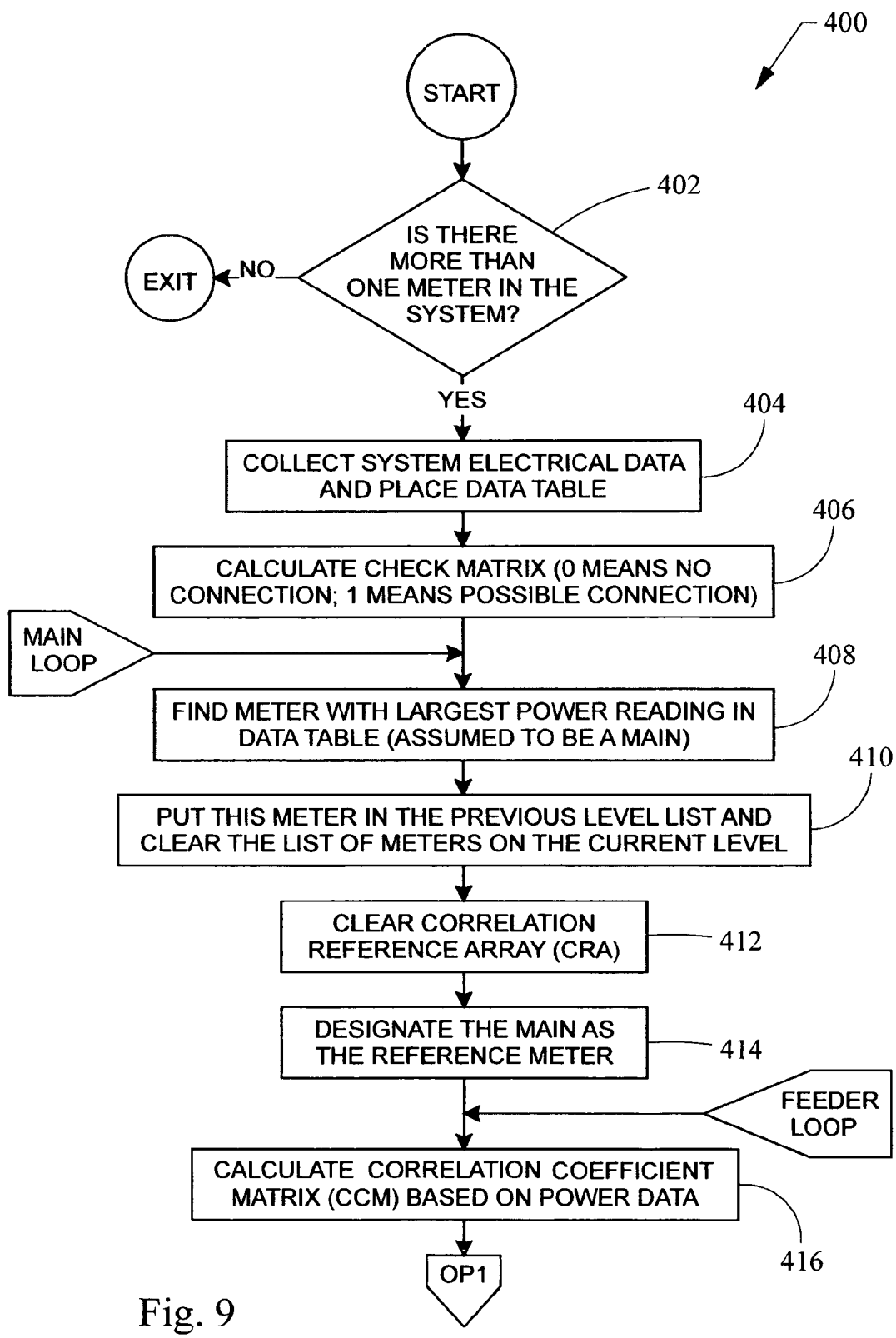

Turning now to the OP3 function, the algorithm 400 determines whether all monitoring devices on the previous level have been analyzed (432), and if not, the next monitoring device (feeder) is obtained on the previous level, and the algorithm 400 returns to the FEEDER LOOP of FIG. 9. If all monitoring devices on the previous level have been analyzed, the algorithm 400 checks whether a connection has been found for all monitoring devices in the hierarchy (434). If so, the algorithm 400 exits. If not, the algorithm 400

TABLE 5

CRA Example With Exemplary Correlation Coefficients

|  | Iteration 1 | Iteration 2 | Iteration 3 | Iteration 4 | Iteration 5 | Iteration 6 | Iteration 7 |
| --- | --- | --- | --- | --- | --- | --- | --- |
| 5-1 | 0.020 | −0.029 | 0.010 | 0.016 | −0.037 | −0.004 | 0.007 |
| 5-2 | 0.043 | −0.020 | −0.037 | −0.009 | −0.095 | −0.091 | −0.099 |
| 5-3 | 0.067 | 0.079 | 0.017 | 0.024 | −0.052 | −0.046 | −0.009 |
| 5-4 | 0.018 | −0.024 | −0.038 | −0.018 | 0.037 | 0.015 | 0.037 |
| 5-5 | 1.000 | 1.000 | 1.000 | 1.000 | 1.000 | 1.000 | 1.000 |
| 5-6 | 0.058 | 0.022 | −0.016 | −0.015 | −0.035 | −0.010 | 0.029 |
| 5-7 | −0.042 | −0.005 | 0.001 | 0.054 | 0.033 | 0.026 | 0.031 |
| 5-8 | −0.034 | −0.016 | −0.057 | −0.058 | 0.005 | −0.034 | −0.049 |
| 5-9 | 0.418 | 0.386 | 0.308 | 0.292 | 0.189 | 0.099 | 0.136 |
| 5-10 | 0.022 | 0.077 | 0.016 | 0.014 | −0.016 | −0.018 | 0.022 |
| 5-11 | 0.649 | −0.048 | −0.090 | −0.095 | −0.076 | −0.077 | −0.014 |
| 5-12 | 0.344 | 0.506 | 0.628 | 0.725 | 0.047 | −0.007 | 0.016 |
| 5-13 | −0.038 | −0.036 | 0.038 | 0.017 | −0.046 | −0.023 | −0.010 |
| 5-14 | 0.483 | 0.591 | 0.072 | 0.044 | 0.066 | −0.006 | 0.004 |
| 5-15 | 0.043 | 0.161 | 0.210 | 0.263 | 0.417 | 0.587 | 0.031 |
| 5-16 | 0.024 | 0.045 | 0.055 | 0.044 | −0.017 | −0.010 | 0.022 |
| 5-17 | −0.057 | −0.063 | −0.101 | −0.090 | −0.061 | −0.048 | −0.049 |
| 5-18 | 0.296 | 0.417 | 0.436 | 0.525 | 0.671 | 0.113 | 0.165 |
| 5-19 | −0.046 | −0.053 | −0.057 | −0.047 | −0.046 | −0.050 | −0.034 |
| 5-20 | 0.398 | 0.549 | 0.633 | 0.128 | 0.069 | 0.054 | 0.061 |
| 5-21 | −0.060 | −0.017 | 0.028 | 0.080 | −0.013 | 0.010 | 0.005 |

Still referring to FIG. 10, the algorithm 400 finds the monitoring device (feeder) in the CRA that has the highest correlation with the reference monitoring device (422). If the correlation does not exceed a threshold (0.5 in a preferred embodiment), the algorithm 400 continues to FIG. 11A (OP3), such as in the case of Iteration 7 in Table 5 shown above.

Otherwise, the algorithm 400 determines whether the current iteration is the first iteration for the reference monitoring device (426), and if not, determines whether the feeder correlation is trending higher (428). If the feeder correlation is not trending higher, the algorithm 400 continues to FIG. 11A (OP3). A higher trend is an indication that the monitoring device is likely on the current level of the hierarchy under consideration.

checks whether the highest correlation coefficient in the CCM exceeds a threshold (436). If not, the algorithm 400 exits. If so, the algorithm 400 determines whether any more monitoring devices are found for the current level (438). If not, the algorithm 400 returns to the MAIN LOOP in FIG. 9. If so, the algorithm moves the monitoring devices on the current level to the previous level (440) and clears the CRA (442). The algorithm returns to the FEEDER LOOP of FIG. 9 to determine the relationships among the remaining monitoring devices on the current level.

Figure 11B:
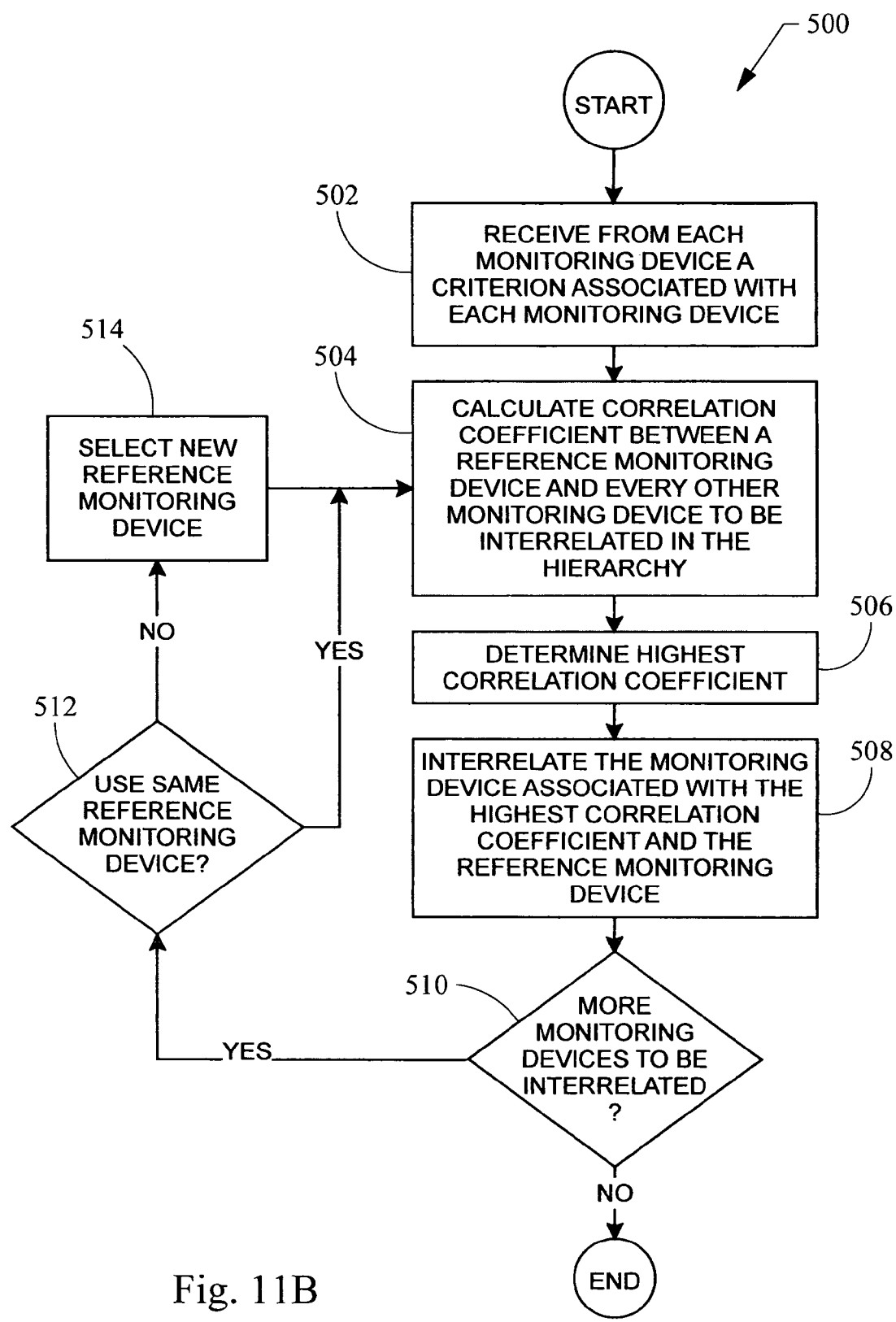
FIG. 11B is a flow chart diagram of an auto-learned hierarchy algorithm in accordance with another embodiment of the present invention.

An auto-learned hierarchy algorithm 500 according to another embodiment of the present invention is illustrated in FIG. 11B. The algorithm 500 starts by receiving from each monitoring device a criterion associated with each monitoring device (502). The criterion can be an electrical parameter, such as power, voltage, current, current distortion, voltage distortion, or energy, or a parameter associated with any WAGES utility, such as volume (BTU, MBTU, gallons, cubic feet) per unit time. The monitoring devices can be power monitoring devices. For example, when the criterion is a voltage distortion, monitoring devices on the same level of the hierarchy will have roughly the same voltage distortion. Additionally or alternatively, the algorithm can use the harmonic distortion values to verify the hierarchy determined by the correlations based on power criteria. Harmonic distortion can also be used by the algorithm to better predict unknown candidates with greater accuracy. For example, a monitoring device may be marginally correlated with a reference device such that the algorithm cannot determine whether a direct link exists or not. Harmonic distortion can rule in or rule out a potential interrelationship depending upon the harmonic distortion values of the neighboring devices on the same level as the monitoring device in question. For example, a different harmonic distortion returned for the monitoring device in question could rule it out as being directly linked with a device on the previous level.

The algorithm 500 calculates a correlation coefficient between a reference monitoring device and every other monitoring device to be interrelated in the hierarchy (504). The algorithm 500 determines the highest correlation coefficient (506) and interrelates the monitoring device associated with the highest correlation coefficient and the reference monitoring device (508). The algorithm 500 checks whether more monitoring devices are to be interrelated (510), and if not, the algorithm 500 ends. If so, the algorithm 500 checks whether to use the same reference monitoring device (512), and if so, recalculates the correlation coefficients (504). Otherwise, the algorithm 500 selects a new reference monitoring device (514), and recalculates the correlation coefficients (504).

Figure 11C:
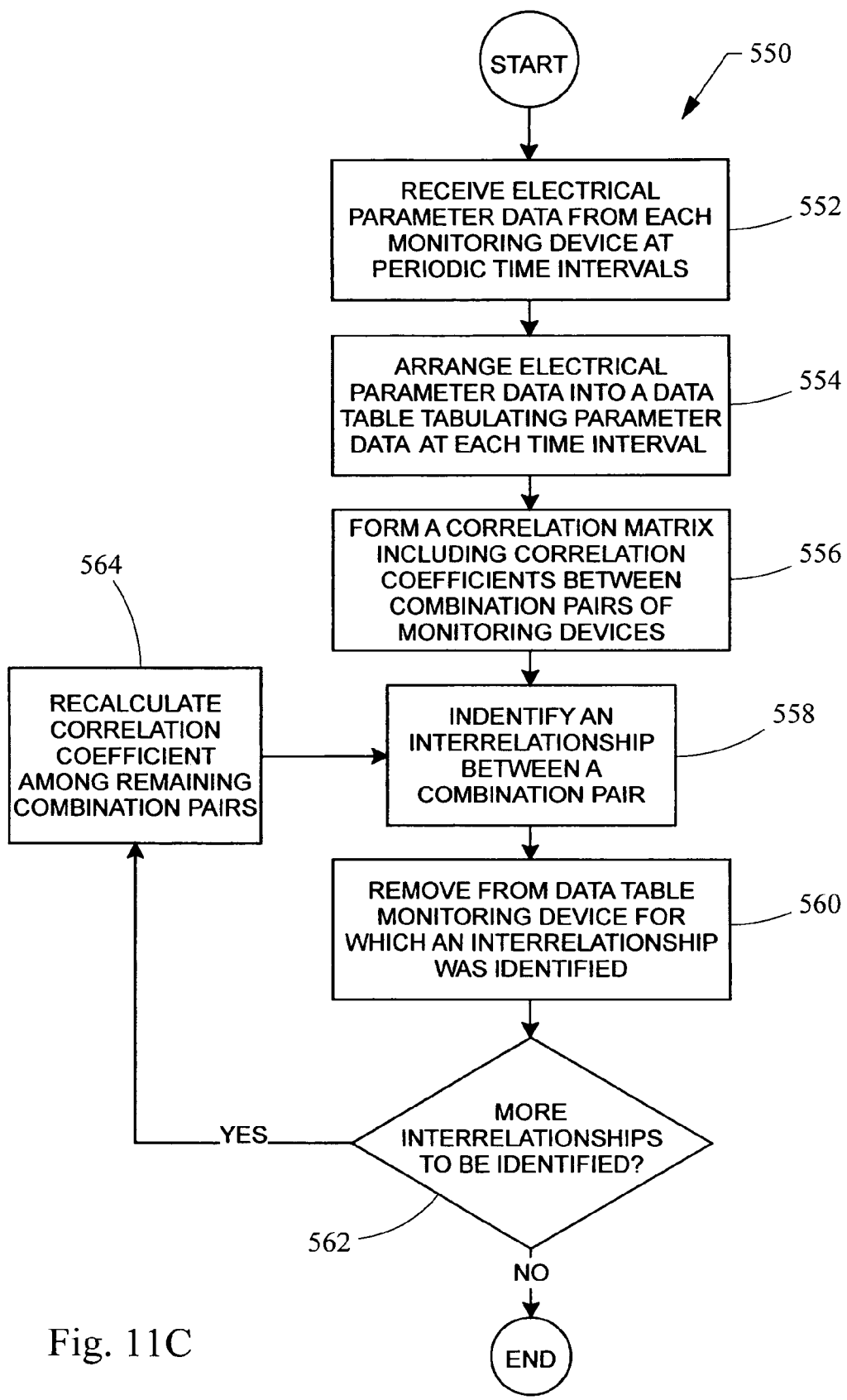
FIG. 11C is a flow chart diagram of an auto-learned hierarchy algorithm in accordance with still another embodiment of the present invention.

An auto-learned hierarchy algorithm 550 according to still another embodiment of the present invention is illustrated in FIG. 11C. The algorithm 550 starts by receiving electrical parameter data from each monitoring device at periodic time intervals (552). The algorithm 550 arranges the electrical parameter data into a data table that tabulates the parameter data at each time interval (554). A correlation matrix is formed that includes correlation coefficients between combination pairs of monitoring devices (556). The algorithm 550 identifies an interrelationship between a combination pair (558) and removes from the data table the power associated with the monitoring device for which an interrelationship was identified (560). If no more interrelationships are to be identified (562), the algorithm 550 ends. Otherwise, it recalculates correlation coefficients among the remaining combination pairs (564) and identifies another interrelationship between the remaining combination pairs (558). This process is repeated until all interrelationships among the monitoring devices have been identified.

The auto-learned hierarchy algorithm according to the various embodiments of the present invention is operable in both radial-fed and multiple radial-fed systems. In multiple radial-fed systems, the algorithm first determines the main meter having the highest power, then determines the hierarchy for that system first before proceeding to the next system(s) having lower power ratings.

The auto-learned hierarchy algorithm has been discussed in various embodiments in which the hierarchy is developed from the top-most level towards the bottom-most level. In an alternate embodiment, an auto-learned hierarchy algorithm develops a hierarchy from the bottom-most level based on events local to each level. For example, monitoring devices proximate to an event will 'see' an event, such as a load turning on or off, before monitoring devices remote from the event will see it. The algorithm recognizes interrelationships among monitoring devices based on the occurrences of events and the timestamps associated with each monitoring device as to when it became aware of an event. By mapping out a chronology of when each monitoring device in the system perceives an event, conclusions can be automatically drawn based upon the time order in which monitoring device perceived that event as to which meters are interrelated (directly linked).

Referring back to FIG. 1, the automated data integrated monitoring system 100 produces contextual data 108 from the data alignment system 104 and the hierarchy classification system 106. The contextual data 108 contains the data from each monitoring device in context with every other monitoring device and is thus more valuable to the user. Contextual analysis of the measured data can be performed, which involves an assessment of the data such that specific external parameters from each monitoring device are aligned or are made known. The primary external parameters of concern include:

The temporal position of each monitoring device's data in the utility system 102 relative to every other monitoring device's data in the utility system 102; and The spatial position of each monitoring device M in the utility system 102 with respect to every other monitoring device M in the utility system 102.

Evaluating all the monitoring data accumulated from the utility system 102 in context will provide a degree of knowledge about the utility system 102 that heretofore was unavailable. Because the information from the entire system (software and monitoring devices) is integrated together through a uniform context, this approach to monitoring a utility system is referred to as Integrated Monitoring (IM).

A useful analogy of the IM approach according to the present invention is the central nervous system of the human body. The brain (software) knows what is going on with the entire body (the monitoring devices) relative to time and position. If a toe is stubbed, the brain sends a signal for the body to react in some manner. Similarly if an electrical event occurs, the IM algorithms executed by the monitoring system software provides useful information to the user on the symptoms throughout the monitored system, potential sources of the problem, and possible solutions or recommendations.

The present invention involves integrating data based on analysis of the data from each monitoring point using special algorithms (for example, a data alignment algorithm and an auto-learned hierarchy algorithm) in the monitoring system software. In the data alignment system 104, subtle but measurable changes in the data's frequency and amplitude are analyzed from all data sources. These changes are used to establish both the common point of data alignment for all data sources and a data source's position in the electrical system with respect to other data sources. Because the process of integrating the system data is performed automatically on algorithms in the monitoring system software, much of the effort and expense required by the user is eliminated. More arbitrary and substantial variations of the parameters being analyzed offers quicker integration of the system data.

There are several benefits associated with IM that are beyond what is presently available including:

The automated IM approach greatly reduces the existing requirements for the user to manually provide detailed information about the power system layout in order to put the system data into context. The IM algorithms analyze data from each monitoring point in the electrical system to automatically determine the system layout with little or no user involvement, saving the user time and resources.

The automated IM approach eliminates the need for special hardware, additional data lines, and, in some cases, monitor accessories. The IM algorithms analyze data from each monitoring point in the electrical system to automatically determine the temporal alignment of the system data, saving the user equipment and labor costs.

The automated IM approach allows an easier configuration of monitoring hardware and software. This is because the IM algorithms automatically put the monitoring information into context throughout the system. Once the monitoring devices are in context, additional decisions regarding hardware and software configuration can automatically be made by the IM algorithms. One example would be setting a monitoring device's under-voltage threshold depending on the monitoring device's location within the electrical system. Again, the automated IM approach saves the user time and resources.

Figure 12:
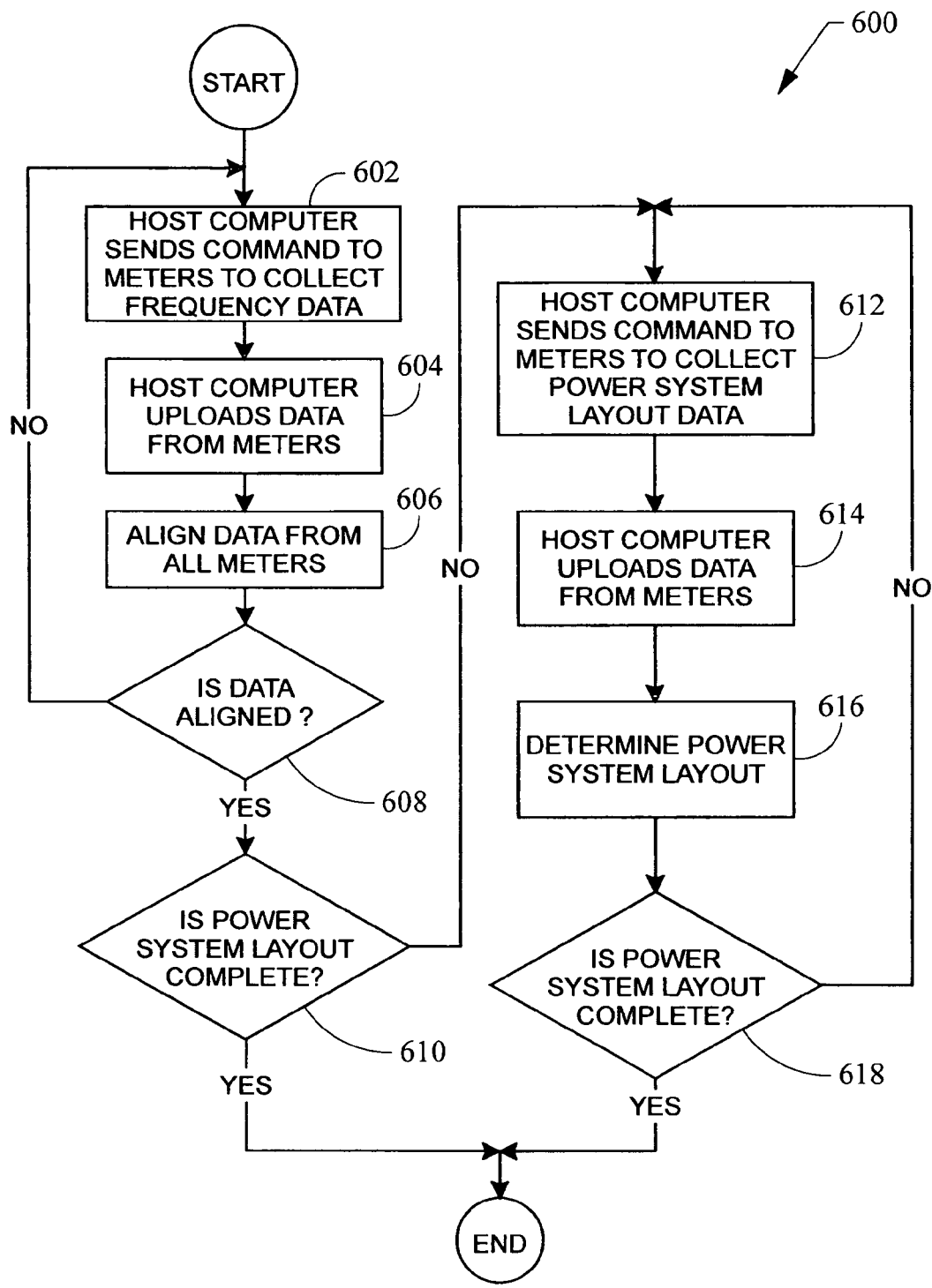
FIG. 12 is a flow chart diagram of an automated integrated monitoring algorithm in accordance with an embodiment of the present invention.

An automated IM algorithm 600 according to an embodiment of the present invention is illustrated in FIG. 12. The algorithm 600 starts by sending a command to the monitoring devices to collect frequency data (602). Data from the monitoring devices is uploaded to the host computer (604) and the data from all the monitoring devices is aligned (606) in accordance with the present invention. When all the data is aligned, the algorithm 600 determines whether the power system layout is complete (610). If so, the algorithm 600 ends, and the contextual data can be used in further software applications.

If the power system layout is not complete, the algorithm 600 sends a command to the monitoring devices to collect power data (612). The host computer running the algorithm 600 uploads the power data from monitoring devices (614) and determines the power system layout (616) in accordance with the present invention. This procedure is repeated until the power system layout is complete (618) at which point the algorithm ends.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of automated integrated monitoring, comprising:
    instructing a plurality of monitoring devices in a radial-fed hierarchy to buffer data indicative of a first parameter for a predetermined period of time;
    receiving said data indicative of said first parameter for each of said plurality of monitoring devices;
    automatically aligning data associated with a reference one of said plurality of monitoring devices and a second one of said plurality of monitoring devices by cross-correlating said data associated with said reference monitoring device and data associated with said second monitoring device such that said data associated with said second monitoring device is shifted relative to said data associated with said reference monitoring device at the point at which a cross-correlation coefficient produced by said cross-correlating exceeds a threshold;
    instructing said plurality of monitoring devices to buffer data indicative of a second parameter at periodic time intervals;
    receiving said data indicative of said second parameter for each of said plurality of monitoring devices;
    automatically determining a hierarchy including said plurality of monitoring devices, their location relative to one another, and their interrelationships relative to one another; and storing data indicative of said hierarchy in a memory.

2. A computer readable medium encoded with instructions for directing a controller to perform the method of claim 1.

3. The method of claim 1, wherein said first parameter is at least one parameter selected from the group consisting of fundamental frequency variations, variations in harmonic frequencies, and amplitude variations.

4. The method of claim 1, wherein said second parameter is at least one parameter selected from the group consisting of power, voltage, current, and distortion.

5. The method of claim 1, wherein said monitoring devices include power meters.

6. The method of claim 1, wherein said automatically determining includes calculating a correlation coefficient.

7. A method of automatically contextualizing data, comprising:
    receiving cycle-by-cycle frequency variation data from a plurality of meters in a radial-fed power monitoring system for a predetermined period of time;
    automatically aligning said frequency variation data by cross-correlating frequency variation data associated with a reference meter and a second meter and shifting the data associated with said second meter relative to said reference meter at the point of maximum correlation;
    receiving power data from said plurality of meters at periodic time intervals;
    automatically learning the hierarchy of said plurality of meters in said radial-fed power monitoring system by calculating correlation coefficients between respective power data associated with pairs of said plurality of meters; and
    storing data indicative of said hierarchy in a memory.

8. The method of claim 7, further comprising displaying said hierarchy.

9. The method of claim 7, further comprising automatically setting an under-voltage threshold of one of said plurality of meters based on said automatically aligning and said automatically learning.

10. The method of claim 7, further comprising synchronizing said reference meter and said second meter at said point of maximum correlation.

11. A method of automatically integrating data in a utility monitoring system, comprising:
    communicating an instruction to at least two monitoring devices of said utility monitoring system to store signal data representing frequency variations on a cycle-by-cycle basis for a predetermined number of cycles;
    responsive to said communicating, receiving from a reference one of said at least two monitoring devices reference signal data corresponding to said signal data stored by said reference monitoring device;
    responsive to said communicating, receiving from a second of said at least two monitoring devices second signal data corresponding to said signal data stored by said second monitoring device;

aligning said first signal data with said second signal data by shifting in cycle increments said second signal data relative to said reference signal data until a maximum cross-correlation coefficient is computed by a cross-correlation function that computes a cross-correlation coefficient at each of said cycle increments;

responsive to said aligning said first signal data, storing in a memory-shifted signal data representing said second signal data shifted relative to said reference signal data by the number of cycle increments that computed the maximum cross-correlation coefficient; receiving parameter data from said at least two monitoring devices at periodic time intervals for a predetermined time period; arranging said parameter data into a data table that tabulates said parameter data for said at least two monitoring devices at each of said periodic time intervals;

forming at least a portion of a correlation matrix that includes correlation coefficients between said at least two monitoring devices, said correlation coefficients being calculated according to a correlation algorithm;

analyzing said correlation matrix to identify an interrelationship between said at least two monitoring devices; and responsive to said analyzing said correlation matrix, storing data representative of the interrelationship in the memory.

12. The method of claim 11, further comprising communicating an instruction to said at least two monitoring devices to mark their respective cycle counts.

13. The method of claim 11, further comprising:
responsive to said aligning, synchronizing said at least two monitoring devices such that at the point of alignment said at least two monitoring devices are temporally aligned.

14. The method of claim 11, further comprising:
providing a reference clock; and
responsive to said aligning, resetting a clock in said reference monitoring device or said second monitoring device to said reference clock.

15. The method of claim 11, further comprising indicating for said at least two monitoring devices whether an interrelationship exists between said at least two monitoring devices.

16. The method of claim 11, wherein said analyzing includes determining whether a correlation coefficient exceeds a correlation threshold for said at least two monitoring devices, and if so, identifying said at least two monitoring devices as interrelated.

17. The method of claim 11, further comprising displaying a hierarchy that includes a representation of said interrelationship between said at least two monitoring devices.

* * * * *